(12) United States Patent
Choi et al.

(10) Patent No.: US 11,609,641 B2
(45) Date of Patent: Mar. 21, 2023

(54) MULTI-STATE KEYBOARD FUNCTION ROW

(71) Applicant: Dell Products L.P., Round Rock, TX (US)

(72) Inventors: Duck Soo Choi, Georgetown, TX (US); Nicholas DiLoreto, Georgetown, TX (US); Joseph McDonald, Austin, TX (US); Jeff Reed, The Hills, TX (US); Mark Schwager, Cedar Park, TX (US); Myungkee Yoon, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/391,561

(22) Filed: Aug. 2, 2021

(65) Prior Publication Data

US 2023/0034154 A1    Feb. 2, 2023

(51) Int. Cl.
  *G06F 3/023* (2006.01)
  *H03K 17/78* (2006.01)
  *H03K 17/96* (2006.01)

(52) U.S. Cl.
  CPC .......... *G06F 3/0238* (2013.01); *H03K 17/78* (2013.01); *H03K 17/9622* (2013.01); *H03K 2217/94026* (2013.01); *H03K 2217/960785* (2013.01)

(58) Field of Classification Search
  None
  See application file for complete search history.

(56) References Cited

U.S. PATENT DOCUMENTS

| | | | |
|---|---|---|---|
| 9,384,916 B1* | 7/2016 | Matsuoka | H01H 13/023 |
| 9,677,740 B2* | 6/2017 | Steiner | H03K 17/962 |
| 2008/0303994 A1* | 12/2008 | Jeng | H01L 27/3232 |
| | | | 349/114 |
| 2013/0050135 A1* | 2/2013 | Stewart | G06F 3/0219 |
| | | | 345/173 |
| 2016/0378234 A1* | 12/2016 | Ligtenberg | G06F 3/0238 |
| | | | 345/176 |
| 2017/0031588 A1* | 2/2017 | Berger | G06F 3/03547 |
| 2018/0068636 A1* | 3/2018 | Kim | H01H 13/83 |
| 2019/0025954 A1* | 1/2019 | Wang | G09F 13/06 |

* cited by examiner

Primary Examiner — Matthew Yeung
(74) Attorney, Agent, or Firm — Kirton McConkie; Brian Tucker

(57) ABSTRACT

A multi-state keyboard function row is provided. A plurality of representations can be formed on an insert of the multi-state keyboard function row. An assembly of the multi-state keyboard function row can be configured to cause either a first set of the representations or a second set of the representations to be visible to a user. A brightness of the representations may also be controlled based on a brightness of ambient light.

20 Claims, 6 Drawing Sheets

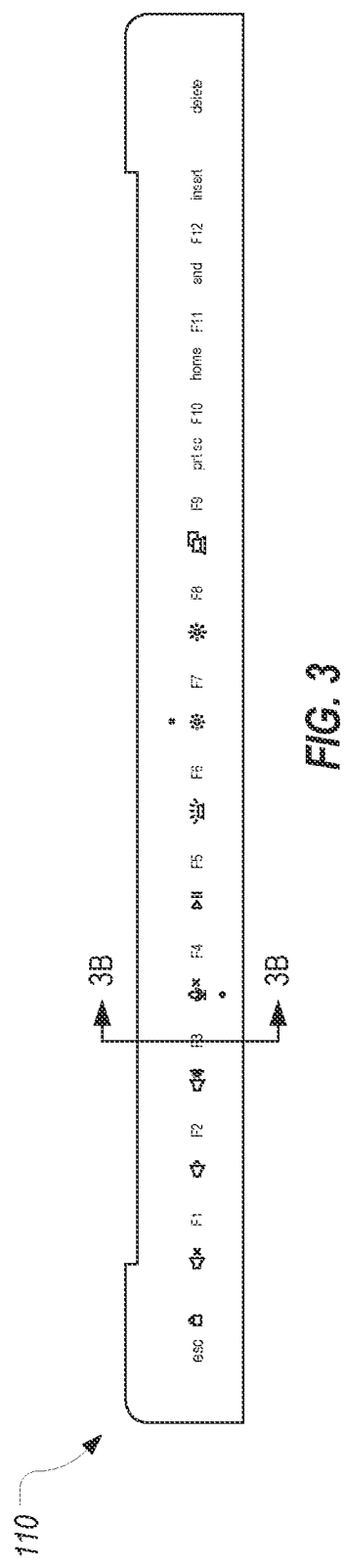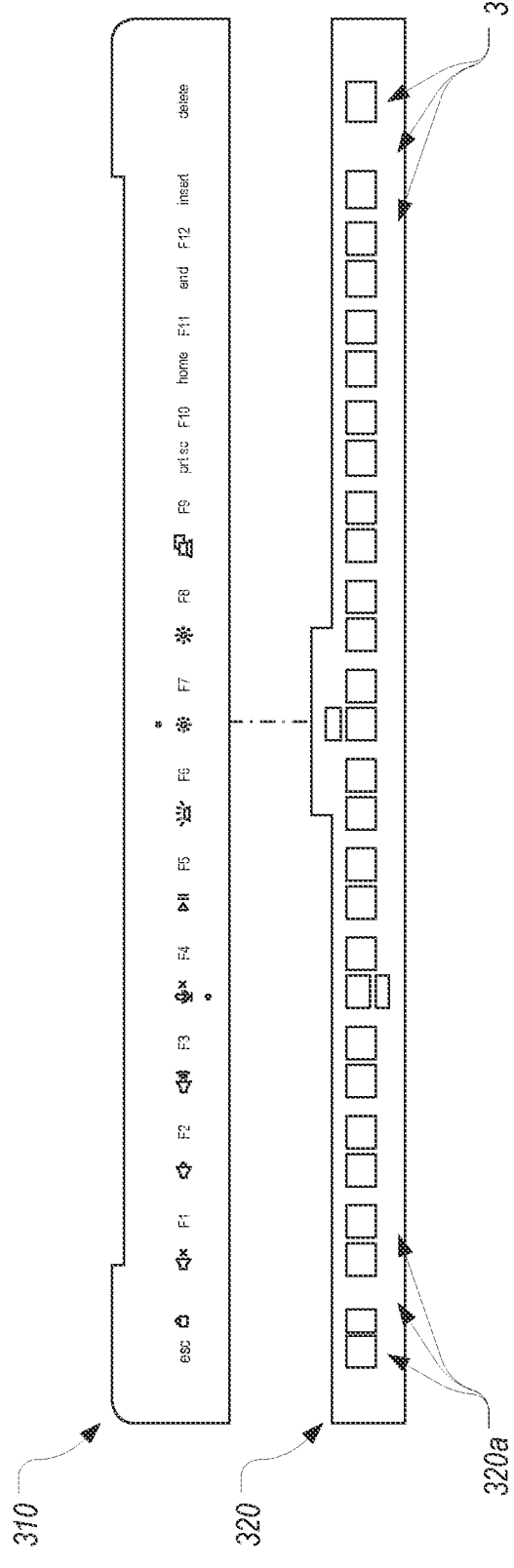

MULTI-STATE KEYBOARD FUNCTION ROW

CROSS-REFERENCE TO RELATED APPLICATIONS

N/A

BACKGROUND

The function row is the row of keys along the top of the keyboard and typically includes the esc key and the F1-F12 keys, among possibly others. Oftentimes, and particularly in the case of a laptop keyboard, the keys in the function row may be assigned a secondary function such as media or display controls. These keys are typically mechanical components on which representations of their assigned functionality is silkscreen printed. For example, the F1 key may also function as a mute key.

BRIEF SUMMARY

The present invention extends to a multi-state keyboard function row and to corresponding methods and computer program products for controlling a multi-state keyboard function row. A plurality of representations can be formed on an insert of the multi-state keyboard function row. An assembly of the multi-state keyboard function row can be configured to cause either a first set of the representations or a second set of the representations to be visible to a user. A brightness of the representations may also be controlled based on a brightness of ambient light.

In some embodiments, the present invention may be implemented as a multi-state keyboard function row. The multi-state keyboard function row may include an insert on which a first set of representations and a second set of representations are formed, and an assembly positioned below the insert. The assembly may include openings for the first set of representations and the second set of representations. The assembly may also include light sources for selectively directing light through the openings to thereby make the first set of representations or the second set of representations visible to a user.

In some embodiments, the present invention may be implemented as a method for displaying representations on a multi-state keyboard function row. A first set of light sources can be driven at a first time to cause a first set of representations to be visible on a sheet of the multi-state keyboard function row. A second set of light sources can be driven at a second time to cause a second set of representations to be visible on the sheet of the multi-state keyboard function row.

In some embodiments, the present invention may be implemented as a keyboard housing that includes a keyboard, a touchpad and a multi-state keyboard function row. The multi-state keyboard function row may include an insert on which a plurality of representations are formed, and an assembly that is configured to cause a first set of the representations to be visible when the multi-state keyboard function row is in a function mode and a second set of the representations to be visible when the multi-state keyboard function row is in a media mode.

This summary is provided to introduce a selection of concepts in a simplified form that are further described below in the Detailed Description. This Summary is not intended to identify key features or essential features of the claimed subject matter.

BRIEF DESCRIPTION OF THE DRAWINGS

Understanding that these drawings depict only typical embodiments of the invention and are not therefore to be considered limiting of its scope, the invention will be described and explained with additional specificity and detail through the use of the accompanying drawings in which:

FIGS. 3, 3A and 3B provide an example of how a multi-state function row may be structured in one or more embodiments of the present invention;

DETAILED DESCRIPTION

Figure 1:
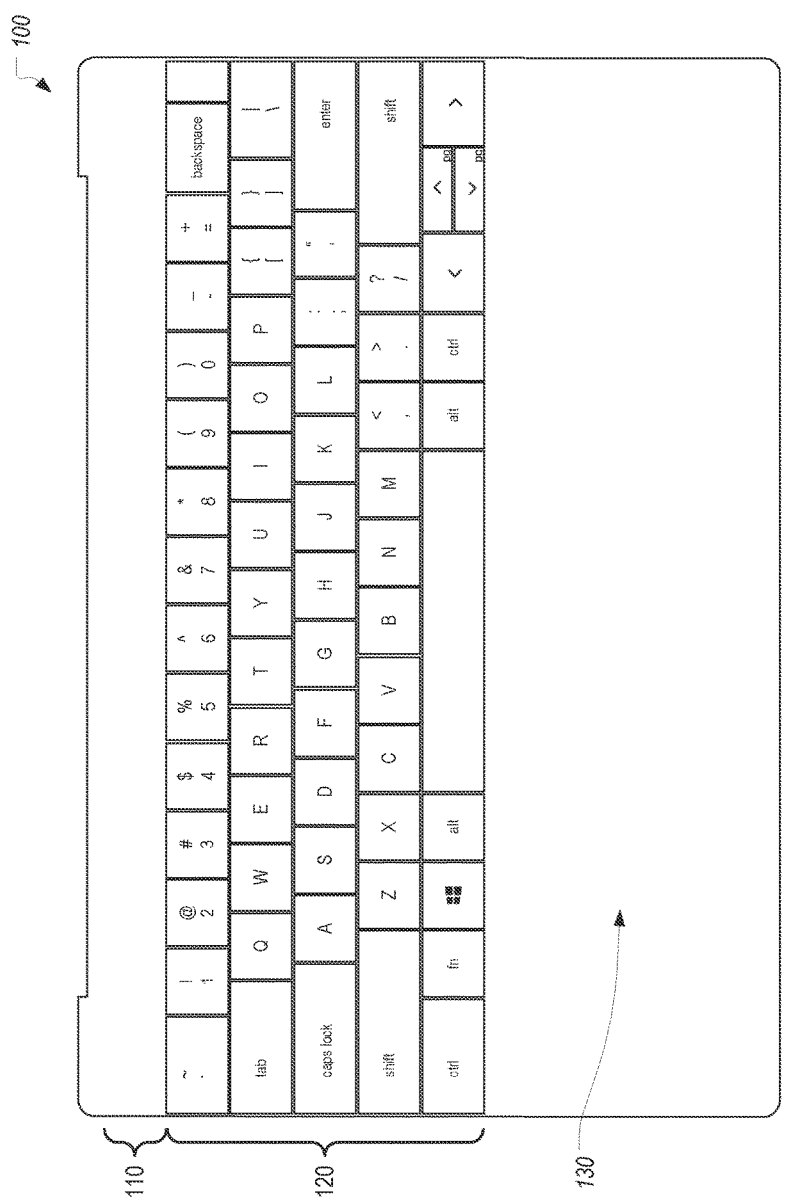
FIG. 1 illustrates an example keyboard housing that includes a multi-state function row in accordance with one or more embodiments of the present invention.

FIG. 1 provides an example of a keyboard housing 100 that includes a multi-state function row 110 in accordance with one or more embodiments of the present invention. Although keyboard housing 100 is configured for use with a laptop (e.g., in the form of a c-cover), multi-state function row 110 could be integrated into other types of keyboard housings.

As shown, keyboard housing 100 may include multi-state function row 110, a keyboard 120, such as a traditional QWERTY keyboard, and a touchpad 130. Keyboard 120 may typically include mechanical keys but could include capacitive touch keys in some embodiments. Multi-state function row 110 can implement the keys of the function row as capacitive touch keys. Also, in some embodiments, touchpad 130 can be implemented as a capacitive touchpad. However, touchpad 130 could be implemented in any suitable way. In FIG. 1, keyboard housing 100 is depicted as being in an off state and therefore no representations are visible on multi-state function row 110.

Figure 2A:
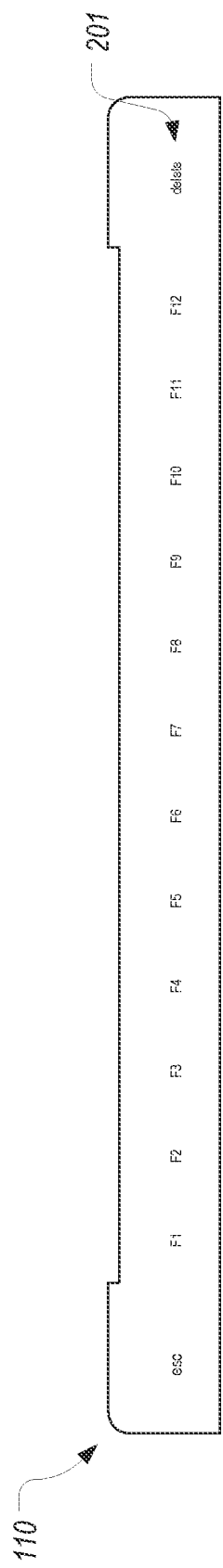
FIGS. 2A-2C provide an example of how a multi-state function row may be configured in one or more embodiments of the present invention.
Figure 2B:
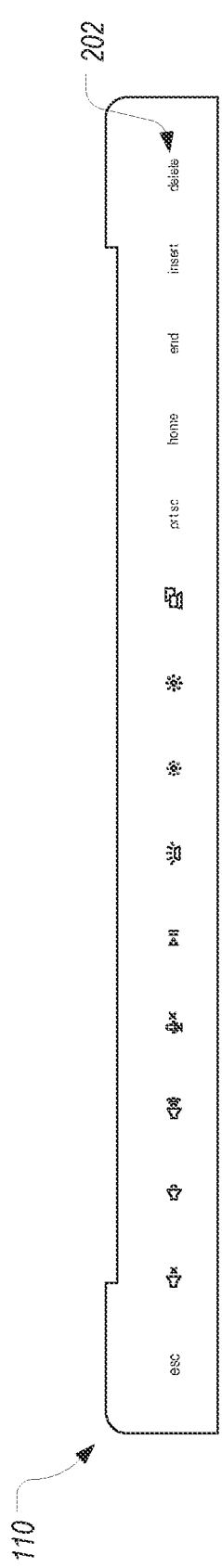
Figure 2C:
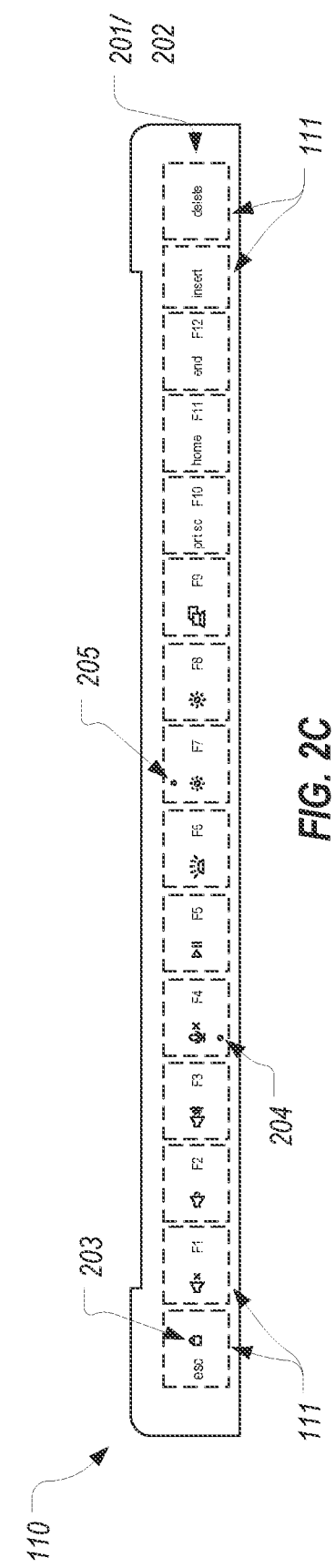

FIGS. 2A-2C provide an example of how multi-state function row 110 may present representations of the function(s) of each key in multi-state function row 110. In the depicted example, the capacitive touch functionality of multi-state function row 110 implements 15 different keys. In other words, the circuitry for implementing the capacitive touch functionality is configured to sense touches in 15 different regions 111 spanning the width of multi-state function row 110. Multi-state function row 110 can be configured to display different sets of representations 201 and 202 in these 15 different regions 111 to represent the functionality that the corresponding keys are assigned at the particular time.

In FIG. 2A, multi-state function row 110 displays a first set of representations 201 corresponding to a function mode of multi-state function row 110. In this example, when in function mode, 14 of the 15 keys of multi-state function row 110 can implement the escape key, the F1-F12 keys and the delete key. Therefore, the first set of representations 201 includes 14 representations for these keys.

In FIG. 2B, multi-state function row 110 displays a second set of representations 202 corresponding to a media mode of multi-state function row 110. In this example, when in media mode, the 15 keys of multi-state function row 110 can implement the escape key, a mute key, a volume down key, a volume up key, a microphone mute key, a play/pause key, a toggle keyboard backlight key, a decrease screen brightness key, an increase screen brightness key, a switch to external display key, a print screen key, a home key, an end key, an insert key and the delete key. Therefore, the second set of representations 202 includes 15 representations for these keys. This is only one example of the set of functions that may be assigned to the keys of the function row when in media mode and other sets/combinations of functions could be assigned.

FIG. 2C shows both the first set of representations 201 and the second set of representations 202 at the same time (although this may not occur in use) along with a mode lock representation 203, a microphone mute indicator 204 and a service code indicator 205, each of which may individually be referred to as a representation 200 and all of which may be collectively referred to as representations 200. In some embodiments, multi-state function row 110 may be configured to display mode lock representation 203 as part of the escape key when the function key is held down to thereby indicate to the user that pressing the escape key while holding the function key will toggle the functionality assigned to the keys of multi-state function row 110 and likewise toggle the display of the first set of representations 201 and the second set of representations 202. Microphone mute indicator 204 can be displayed when the microphone is muted (e.g., in response to the user pressing the microphone mute key). Service code indicator 205 can be used to present blinking codes when service codes are reported during boot or at other times.

FIG. 2C also includes dashed boxes to represent regions 111 where the capacitive touch keys may be implemented. Notably, the region 111 within which a particular capacitive touch key is implemented may encompass the locations of the multiple representations 200 that may be assigned to the particular capacitive touch key. In some embodiments, the shape, size and/or position of regions 111 may be static. In other embodiments, the shape, size and/or position of regions 111 may be adjusted based on the mode of multi-state function row 110. For example, the position of regions 111 could be shifted so that they are centered around the representations 200 that are currently visible.

Figure 3B:
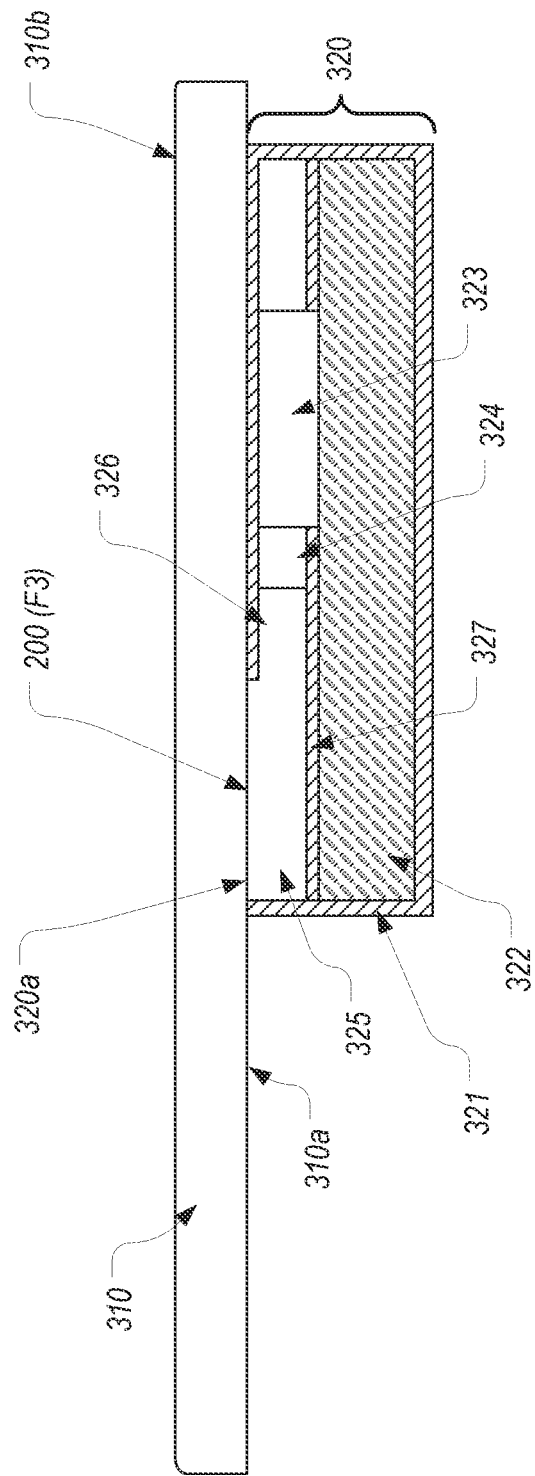

FIGS. 3, 3A and 3B provide an example of how multi-state function row 110 may be structured to enable representations 200 to be selectively displayed. FIG. 3A is an exploded view showing that multi-state function row 110 may include an insert 310 that forms the outer (or upper) surface of multi-state function row 110 and an assembly 320 that is positioned under insert 310. In some embodiments, insert 310 may be formed of glass. However, any other suitably transparent material could be used.

A bottom surface 310a of insert 310 may include an opaque layer through which representations 200 are formed (e.g., as openings in or cutouts through the opaque layer). In other words, bottom surface 310a may block the transmission of light into insert 310 except through representations 200. Assembly 320 can form a number of upward-facing openings 320a each of which may align with a particular representation 200 formed on bottom surface 310a of insert 310. For example, in the embodiment shown in the figures, there are 30 representations 200, and therefore, there may be 30 openings 320a. As described in detail below, openings 320a can function to direct light through the corresponding representation 200 to cause the representation 200 to be visible to the user. In some embodiments, a top surface 310b of insert 310 may be etched with a conductive material (e.g., silver) to enable the capacitive touch keys to be implemented in regions 111.

As shown in FIG. 3, FIG. 3B is a cross-section of multi-state function row 110 taken through representation 200 of the F3 key. Accordingly, FIG. 3A can represent how multi-state function row 110 is structurally configured to enable "F3" to be selectively displayed within the respective region 111. A similar structural configuration could be used to enable each of the other representations 200 to be displayed.

As shown in FIG. 3B, assembly 320 may include a housing 321 that is secured to bottom surface 310a of insert 310 (e.g., via an adhesive) to position each opening 320a around its corresponding representation 200. A printed circuit board assembly (PCBA) 322 may be contained within or otherwise supported by housing 321. A light source 323, such as an LED, may be mounted to PCBA 322 proximate to each opening 320a. A channel 325 may be formed between each light source 323 and its corresponding opening 320a to thereby allow light emitted by light source 323 to exit opening 320a and pass through insert 310 via representation 200. In some embodiments, a light guide plate 324 may be positioned within channel 325 between light source 323 and opening 320a to direct light towards opening 320a. Also, in some embodiments, a bottom surface of channel 325 may be lined with a reflective material 327 to direct light upwardly through opening 320a. To prevent light from passing into an adjacent channel 325, each sidewall of channel 325 may be lined with or formed by a shading sheet 326. Accordingly, light emitted from light source 323 can be confined within the particular channel 325 within which the light source 323 is situated to thereby illuminate only the particular representation 200 positioned within the respective opening 320a.

Notably, this same (or similar) structural configuration can be used immediately adjacent to the structural configuration shown in FIG. 3B to thereby allow the representation 200 for the volume up key/functionality to be illuminated separately from the representation 200 for the F3 key/functionality even though both representations 200 are positioned within the same region 111 that implements a single capacitive touch key. In other words, depending on the mode of multi-state function row 110, one of the two light sources 323 can be driven to cause only one of the F3 or volume up representations 200 to be displayed within the respective region 111. The same is true for the other pairs of representations 200 that may be displayed within other regions 111.

In some embodiments, multi-state function row 110 may be configured to display only the first set of representations 201 (and possibly service code indicator 205) during the boot process of a computing device with which keyboard housing 100 is integrated or used. In particular, the light sources 323 corresponding to the first set of representations 201 may be driven and the light sources corresponding to the second set of representations 202 may not be driven during the boot process. In some embodiments, once the operating system has been loaded, multi-state function row 110 may transition to displaying only the second set of representations 202 (and mode lock representation 203 and/or microphone mute indicator 204 as appropriate). Then, multi-state function row 110 may be toggled between the first set of representations 201 and the second set of representations 202 such as in response to the user pressing the function and escape keys. When the computing device is turned off or is in a sleep or suspended mode, multi-state function row 110 may be configured to display no representations 200.

Figure 4:
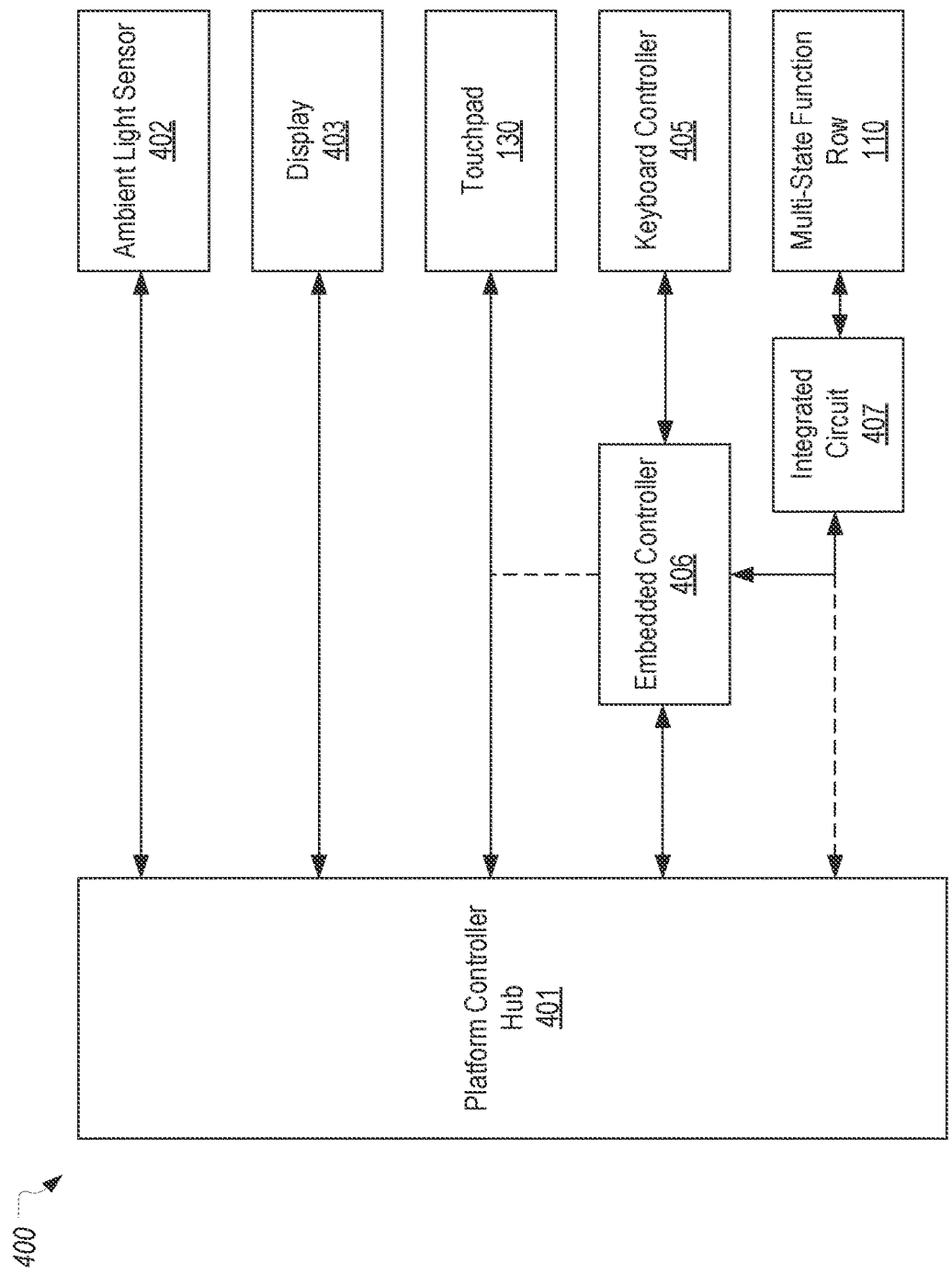
FIG. 4 provides a block diagram of an example computing architecture that may be used in one or more embodiments of the present invention.

FIG. 4 provides a block diagram of an example computing architecture 400 that may be used on a computing device with which keyboard housing 100 is integrated or used. As shown, computing architecture 400 may include a platform controller hub 401, an ambient light sensor 402, a display 403, touchpad 130, a keyboard controller 405, an embedded controller 406, an integrated circuit 407 and multi-state function row 110.

Ambient light sensor 402 can be configured to provide signals to platform controller hub 401 indicative of the brightness of ambient light that is incident on or near multi-state function row 110. For example, ambient light sensor 402 could be positioned adjacent to the hinge of keyboard housing 100. Based on such signals, platform controller hub 401 can interface with multi-state function row 110 (e.g., via integrated circuit 407 and/or embedded controller 406) to adjust the brightness of the representations 200 that are currently made visible on multi-state function row 110. For example, based on input from platform controller hub 401 and/or embedded controller 406, integrated circuit 407 could adjust the voltage supplied to light sources 323 or otherwise control the brightness of light sources 323. In some embodiments, platform controller hub 401 may also use the signals received from ambient light sensor 402 to control the brightness of display 402, any lighting for touchpad 130, a backlight for keyboard 120 or any other lighting on or in keyboard housing 100.

Embedded controller 406 may interface with keyboard controller 405 to implement the mechanical and capacitive touch keys of keyboard housing 100. Integrated circuit 407, which may be part of PCBA 322 in some embodiments, may be configured to drive light sources 323 of multi-state function row 110 based on control signals from embedded controller 406 and/or platform controller hub 401. For example, if the user presses the function key, keyboard controller 405 can detect the key press and notify embedded controller 406. In response, embedded controller 406 could interface with integrated circuit 407 to toggle multi-state function row 110 from the media mode to the function mode (i.e., to drive the light sources 323 for the first set of representations 201 rather than the light sources 323 for the second set of representations 202). Similarly, during the boot process, platform controller hub 401, possibly via embedded controller 406, could cause integrated circuit 407 to drive the light sources 323 for the first set of representations 201. Then, once the boot process has completed, platform controller hub 401, possibly via embedded controller 406, could cause integrated circuit 407 to drive the light sources 323 for the second set of representations 202.

Figure 5:
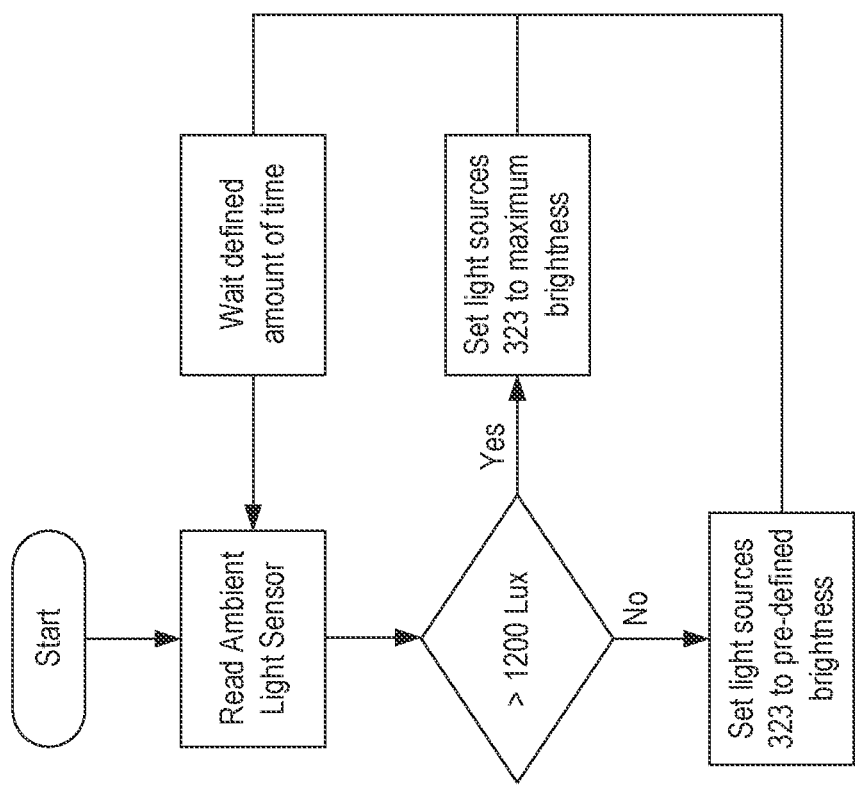
FIG. 5 provides a flow diagram of an example process by which the brightness of a multi-state function row may be controlled.

FIG. 5 provides a flow diagram representing how the brightness of representations 200 can be controlled in one or more embodiments of the present invention. Initially, ambient light sensor 402 can be read to determine the brightness of the ambient light. If the brightness is greater than some threshold, such as 1200 Lux which could represent scenarios when keyboard housing 100 is outdoors, the light sources 323 that are currently on can be set to their maximum brightness (e.g., 50 nits). In contrast, if the brightness of the ambient light is less than the threshold, which could represent scenarios when keyboard housing 100 is indoors, the light sources 323 that are currently on can be set to a pre-defined (including user-defined) brightness that is less than the maximum brightness. In some embodiments, the pre-defined brightness can be selected from a set of pre-defined brightnesses based on the current reading of ambient light sensor 402. For example, light sources 323 can be set to 4.5 nits when the brightness of the ambient light is below a lower threshold, to 7.5 nits when the brightness of the ambient light is below a middle threshold and to 15 nits when the brightness of the ambient light is below an upper threshold. In some embodiments, the brightness of a keyboard backlight (e.g., for illuminating keyboard 120) could also be controlled using this process.

As this process for setting the brightness of representations 200 is being performed, various events could be detected, and in response, representations 200 could be turned off. For example, if the lid of a laptop is closed, the light sources 323 that are currently on can be turned off so that no representations 200 are visible regardless of the reading of ambient light sensor 402.

In summary, a multi-state keyboard function row that is configured in accordance with one or more embodiments of the present invention may be configured to display either a first set of representations or a second set of representations for the capacitive touch keys implemented thereon. The brightness of these representations may be adjusted based on a brightness of ambient light.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description.

What is claimed:

1. A keyboard housing comprising:
a keyboard;
a touchpad positioned below the keyboard; and
a multi-state keyboard function row positioned above the keyboard, the multi-state keyboard function row comprising:
an insert comprising a single sheet that extends along the keyboard, the insert being configured to implement at least 12 capacitive touch keys in corresponding at least 12 regions that span a width of the insert, the insert forming a first set of representations and a second set of representations, each of the at least 12 regions encompassing one of the first set of representations and one of the second set of representations; and
an assembly positioned below the insert, the assembly including openings for the first set of representations and the second set of representations, the assembly further including light sources for selectively directing light through the openings to thereby make either the first set of representations or the second set of representations visible to a user such that, when the first set of representations are made visible, each of the at least 12 regions display the corresponding one of the first set of representations and when the second set of representations are made visible, each of the at least 12 regions includes the corresponding one of the second set of representations.

2. The multi-state keyboard function row of claim 1, wherein the insert is formed of glass.

3. The multi-state keyboard function row of claim 1, wherein at least some of the regions are adjusted based on whether the first set of representations or the second set of representations are visible to the user.

4. The multi-state keyboard function row of claim 1, wherein the assembly includes channels between the light sources and the openings.

5. The multi-state keyboard function row of claim 4, wherein the channels include one or more shading sheets to prevent light from passing between channels.

6. The multi-state keyboard function row of claim 4, wherein the channels include one or more reflective sheets to direct light out through the openings.

7. The multi-state keyboard function row of claim 4, wherein the channels include light guide plates to direct light towards the openings.

8. The multi-state keyboard function row of claim 1, wherein the openings comprise a separate opening for each representation in the first set of representations and for each representation in the second set of representations.

9. The multi-state keyboard function row of claim 8, wherein the lights sources comprise a separate light source for each of the openings.

10. The multi-state keyboard of claim 1, wherein one or more of a mode lock representation, a microphone mute indicator or a service code indicator are formed on the insert.

11. The multi-state keyboard of claim 1, wherein a brightness of the light sources is adjusted based on a brightness of ambient light.

12. A keyboard housing comprising:
a keyboard;
a touchpad positioned below the keyboard; and
a multi-state keyboard function row positioned above the keyboard, the multi-state keyboard function row comprising:
an insert comprising a single sheet that extends along the keyboard, the insert being configured to implement at least 12 capacitive touch keys in corresponding at least 12 regions that span a width of the insert, the insert forming a first set of representations and a second set of representations, each of the at least 12 regions encompassing one of the first set of representations and one of the second set of representations; and
an assembly positioned below the insert, the assembly including openings for the first set of representations and the second set of representations, wherein the openings comprise a separate opening for each representation in the first set of representations and for each representation in the second set of representations, the assembly further including light sources for selectively directing light through the openings to thereby make either the first set of representations or the second set of representations visible to a user such that, when the first set of representations are made visible, each of the at least 12 regions display the corresponding one of the first set of representations and when the second set of representations are made visible, each of the at least 12 regions includes the corresponding one of the second set of representations;
wherein at least some of the regions are adjusted based on whether the first set of representations or the second set of representations are visible to the user.

13. The multi-state keyboard function row of claim 12, wherein the assembly includes channels between the light sources and the openings.

14. The multi-state keyboard function row of claim 13, wherein the channels include one or more shading sheets to prevent light from passing between channels.

15. The multi-state keyboard function row of claim 13, wherein the channels include one or more reflective sheets to direct light out through the openings.

16. The multi-state keyboard function row of claim 13, wherein the channels include light guide plates to direct light towards the openings.

17. A computing device comprising:
a platform controller hub;
an ambient light sensor;
a display;
a keyboard controller;
an embedded controller;
an integrated circuit; and
a keyboard housing comprising:
a keyboard;
a touchpad positioned below the keyboard; and
a multi-state keyboard function row positioned above the keyboard, the multi-state keyboard function row comprising:
an insert comprising a single sheet that extends along the keyboard, the insert being configured to implement at least 12 capacitive touch keys in corresponding at least 12 regions that span a width of the insert, the insert forming a first set of representations and a second set of representations, each of the at least 12 regions encompassing one of the first set of representations and one of the second set of representations; and
an assembly positioned below the insert, the assembly including openings for the first set of representations and the second set of representations, the assembly further including light sources for selectively directing light through the openings to thereby make either the first set of representations or the second set of representations visible to a user such that, when the first set of representations are made visible, each of the at least 12 regions display the corresponding one of the first set of representations and when the second set of representations are made visible, each of the at least 12 regions includes the corresponding one of the second set of representations;
wherein the keyboard controller is configured to detect when the user presses a function key of the keyboard and in response notify the embedded controller, and wherein in response to the notification, the embedded controller is configured to interface with the integrated circuit to cause the second set of representations to be visible rather than the first set of representations.

18. The computing device of claim 17, wherein the ambient light controller is positioned adjacent to the multi-state keyboard function row and is configured to provide to the platform controller hub signals indicative of a brightness of ambient light incident on the multi-state keyboard function row, and wherein the platform controller hub is configured to interface with the embedded controller or the integrated circuit to adjust a brightness of the first or second set of representations based on the signals.

19. The computing device of claim of claim 18, wherein the assembly includes channels between the light sources and the openings, and wherein the channels include one or more shading sheets to prevent light from passing between channels, one or more reflective sheets to direct light out through the openings, and light guide plates to direct light towards the openings.

20. The computing device of claim 19, wherein the openings comprise a separate opening for each representation in the first set of representations and for each representation in the second set of representations, and wherein the lights sources comprise a separate light source for each of the openings.

* * * * *